United States Patent
Hwang et al.

(10) Patent No.: US 6,539,528 B2
(45) Date of Patent: Mar. 25, 2003

(54) METHODS, SYSTEMS, AND COMPUTER PROGRAM PRODUCTS FOR DESIGNING AN INTEGRATED CIRCUIT THAT USE AN INFORMATION REPOSITORY HAVING CIRCUIT BLOCK LAYOUT INFORMATION

(75) Inventors: Chan-seok Hwang, Yongin (KR); Yong-jin Lee, Seoul (KR); Dae-hee Lee, Kyungki-do (KR); Jong-bae Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 37 days.

(21) Appl. No.: 09/826,579

(22) Filed: Apr. 5, 2001

(65) Prior Publication Data

US 2002/0029371 A1 Mar. 7, 2002

(30) Foreign Application Priority Data

Apr. 6, 2000 (KR) .......................................... 2000-17903

(51) Int. Cl.[7] ................................................. G06F 9/45
(52) U.S. Cl. ................................. 716/10; 716/7; 716/12
(58) Field of Search ................................... 716/1, 7–14

(56) References Cited

U.S. PATENT DOCUMENTS

| | | | |
|---|---|---|---|
| 5,461,576 A | 10/1995 | Tsay et al. ..................... 716/6 |
| 5,483,461 A | * 1/1996 | Lee et al. ..................... 716/14 |
| 5,768,479 A | * 6/1998 | Gadelkarim et al. .......... 706/45 |
| 6,002,633 A | * 12/1999 | Oppold et al. ......... 365/230.03 |

FOREIGN PATENT DOCUMENTS

JP       7007142       1/1995

* cited by examiner

*Primary Examiner*—Tuan T. Lam
*Assistant Examiner*—Long Nguyen
(74) *Attorney, Agent, or Firm*—Myers Bigel Sibley & Sajovec, P.A.

(57) ABSTRACT

An integrated circuit (IC) is designed by generating a circuit diagram of the IC using one or more blocks. An information repository is provided that contains layout information that is associated with one or more template blocks. A symbol layout abstraction model is then generated by associating the layout information that is associated with one or more of the template blocks with at least one of the circuit diagram blocks of the IC.

28 Claims, 5 Drawing Sheets

METHODS, SYSTEMS, AND COMPUTER PROGRAM PRODUCTS FOR DESIGNING AN INTEGRATED CIRCUIT THAT USE AN INFORMATION REPOSITORY HAVING CIRCUIT BLOCK LAYOUT INFORMATION

RELATED APPLICATION

This application claims the benefit of Korean Patent Application No. 2000-17903, filed Apr. 6, 2000, the disclosure of which is hereby incorporated herein by reference.

FIELD OF THE INVENTION

The present invention relates generally to design and layout of integrated circuits and, more particularly, to design and layout of integrated circuits that include circuits comprising standard and/or non-standard cells.

BACKGROUND OF THE INVENTION

An integrated circuit (IC) is typically designed by generating a circuit diagram first and then designing a layout based on the circuit diagram. In the layout, material layers such as a conductive layer, a semiconductor layer, and an insulating layer are formed of predetermined patterns to create each circuit element of the circuit diagram. Each of the predetermined patterns may also be horizontally and/or vertically arranged. An IC having the desired functions may be produced by repeating the operations of stacking and patterning each material layer based on the layout. Conventional operations for design and layout of an IC will be described in more detail hereafter with reference to FIG. 1.

Operations begin by drawing the IC as a circuit diagram (block 10). The IC is typically drawn using units of cells and/or blocks in which basic elements, such as a transistor or a resistor, are enclosed in a predetermined functional unit using a design program having a graphical user interface. In non-memory integrated circuits, such as a microprocessor or an application specific integrated circuit (ASIC), an inverter or a logic gate, such as an AND gate, may comprise one cell. By contrast, in memory integrated circuits, such as a dynamic random access memory (DRAM) or a static random access memory (SRAM), a block may comprise many transistors or logic gates (see, e.g., the clock buffer of FIG. 4). In particular, when a cell comprises a single logic gate, as is typically common in non-memory ICs, the cell may be referred to as a standard cell. When a cell comprises a plurality of elements that are not enclosed in a single logic gate, however, the cell may be referred to as a non-standard cell. Thus, a circuit diagram of a memory IC is typically drawn using blocks that comprise standard and non-standard cells. The circuit diagram of an IC may be expressed as a set of symbols having an electrical meaning and the underlying circuit of each cell or block (i.e., the circuit at the transistor level) is generally referred to as a schematic circuit.

Once a circuit diagram for an IC is designed, operations of the IC may be simulated based on the circuit diagram to verify whether the IC operates properly. If the simulation results indicate that the IC does not operate properly, then the circuit diagram may be corrected. After the circuit diagram has been designed and simulated, the layout in each cell or block is designed (block 11). More specifically, each cell or block is laid out by designing material patterns having an actual physical meaning based on the schematic circuit of each cell or block. Moreover, relationships are established between the horizontal and vertical positions of the material patterns. Standard layouts typically exist for the underlying circuits that comprise standard cells; therefore, layout operations may be automated using a layout design tool. Unfortunately, non-standard cells are typically laid out manually. Because memory ICs typically include non-standard cells, the most time consuming operation in designing memory ICs is typically the layout of the individual blocks.

When the initial layout of each cell or block is completed, each cell or block may be arranged in the restricted size of an actual chip, and a cell layout abstraction model or block layout abstraction model having information used to connect the cells or blocks is generated (step 12). The cell or block layout abstraction model may include the size of the cell or block, the available positions of input/output pins connected to another cell or block, and obstruction(s) (e.g., a dummy pattern), through which an interconnection for connecting the cells or blocks can not pass.

Next, the placement and routing of each cell or block are performed based on the cell or block layout abstraction model (step 13). Conventionally, the placement and routing is performed using an automated tool. After placing and routing each cell or block, the design and layout of the IC is complete.

As ICs become more highly integrated, parasitic capacitance or resistance between interconnections for connecting cells or blocks may affect the performance of the ICs. Therefore, the parasitic capacitance and resistance between the interconnections for connecting the cells or blocks are calculated based on the layout in which the placement and routing of the cells or blocks has been completed (block 14). If the parasitic capacitance and/or resistance deviate from a predetermined reference value, then operations continue at block 10 where the circuit diagram is corrected, and the operations of blocks 11 through 14 are repeated. As a result, operations for laying out the cells or blocks are performed again as the previous layout may generally not be reused. Because these cell or block layout operations may be time consuming, especially for non-standard cells, the overall time to design and layout the IC may significantly increase.

SUMMARY OF THE INVENTION

According to embodiments of the present invention, an integrated circuit (IC) is designed by generating a circuit diagram of the IC using a first plurality of blocks. An information repository is provided that comprises layout information that is associated with one or more template blocks. A symbol layout abstraction model is then generated by associating the layout information that is associated with one or more of the template blocks with at least one of the first plurality of blocks that comprise the circuit diagram of the IC. The symbol layout abstraction model may include size information and/or pin position information, which may be used in arranging the blocks and/or determining routing paths for interconnections between the pins of the various blocks. A block may comprise non-standard cells, which may be designed and laid out manually in a time intensive process. Advantageously, the information repository may allow the symbol layout abstraction model to be generated without first performing a design layout for the underlying cells that comprise the circuit diagram blocks.

The layout information that is respectively associated with the template blocks may comprise one or more of the following types of information: size information, pin position information, obstruction information, information related to the numbers of circuit elements contained in a template block, and information related to the sizes of these circuit elements.

In accordance with further embodiments of the present invention, after the symbol layout abstraction model is generated, an initial arrangement of the first plurality of blocks may be generated and initial interconnections between the blocks may be determined based on the symbol layout abstraction model. A parasitic capacitance and/or a resistance for one or more of the interconnections may then be estimated and a determination made whether the parasitic capacitance and/or resistance are within a predetermined reference value. If the parasitic capacitance and/or resistance is not within the predetermined reference value, then a revised circuit diagram of the IC may be generated using a second plurality of blocks and the operations discussed above may be repeated for the revised circuit diagram.

If the parasitic capacitance and/or resistance is within the predetermined reference value, then, in accordance with further embodiments of the present invention, a design layout may be performed for the first plurality of blocks by designing material patterns for the respective blocks based on the circuit diagram. An actual layout abstraction model may then be generated that comprises layout information associated with the respective material patterns. The layout information may comprise size information, pin position information, and/or obstruction information.

In accordance with still further embodiments of the present invention, a final arrangement of the first plurality of blocks may be generated based on the initial arrangement of the first plurality of blocks and the actual layout abstraction model. In addition, final interconnections may then be determined between the first plurality of blocks based on the initial interconnections and the actual layout abstraction model.

In accordance with further embodiments of the present invention, the material patterns for the respective first plurality of blocks may be designed and the actual layout abstraction model may be generated in parallel with generating the symbol layout abstraction model, generating the initial arrangement of the first plurality of blocks, determining the initial interconnections, estimating the parasitic capacitance and/or the resistance for one or more of the initial interconnections, and/or determining whether the estimate is within the predetermined reference value.

In summary, the present invention may allow the symbol layout abstraction model for each block to be generated directly from the IC circuit diagram though use of an information repository that comprises template blocks with associated size and/or pin position information. Furthermore, the present invention may allow the blocks to be arranged, routes for interconnections between the blocks to be defined, and/or corrections of the schematic circuit to be performed without designing actual layouts for the blocks. Accordingly, the time required to design and layout an IC may be reduced.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
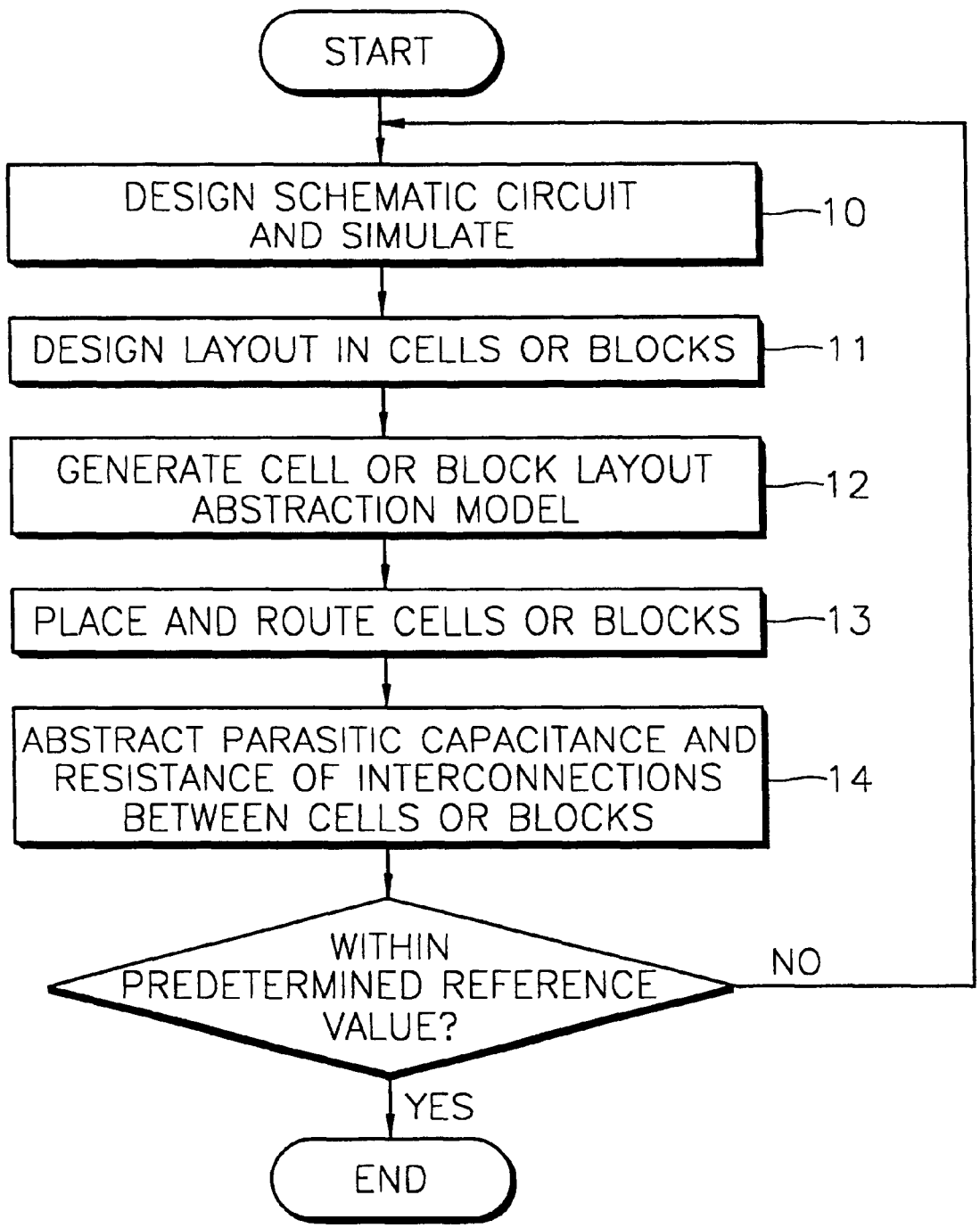
FIG. 1 is a flowchart that illustrates conventional operations for designing an integrated circuit (IC)

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The present invention may be embodied as methods, systems, and/or computer program products. Accordingly, the present invention may be embodied in hardware and/or in software (including firmware, resident software, microcode, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of the respective program modules may be written in a high-level programming language, such as C or C++, for development convenience. Nevertheless, some modules or routines may be written in assembly language or even micro-code to enhance performance and/or memory usage. It will be further appreciated that the functionality of any or all of the program modules may also be implemented using discrete hardware components, a single application specific integrated circuit (ASIC), or a programmed digital signal processor or microcontroller.

Figure 2:
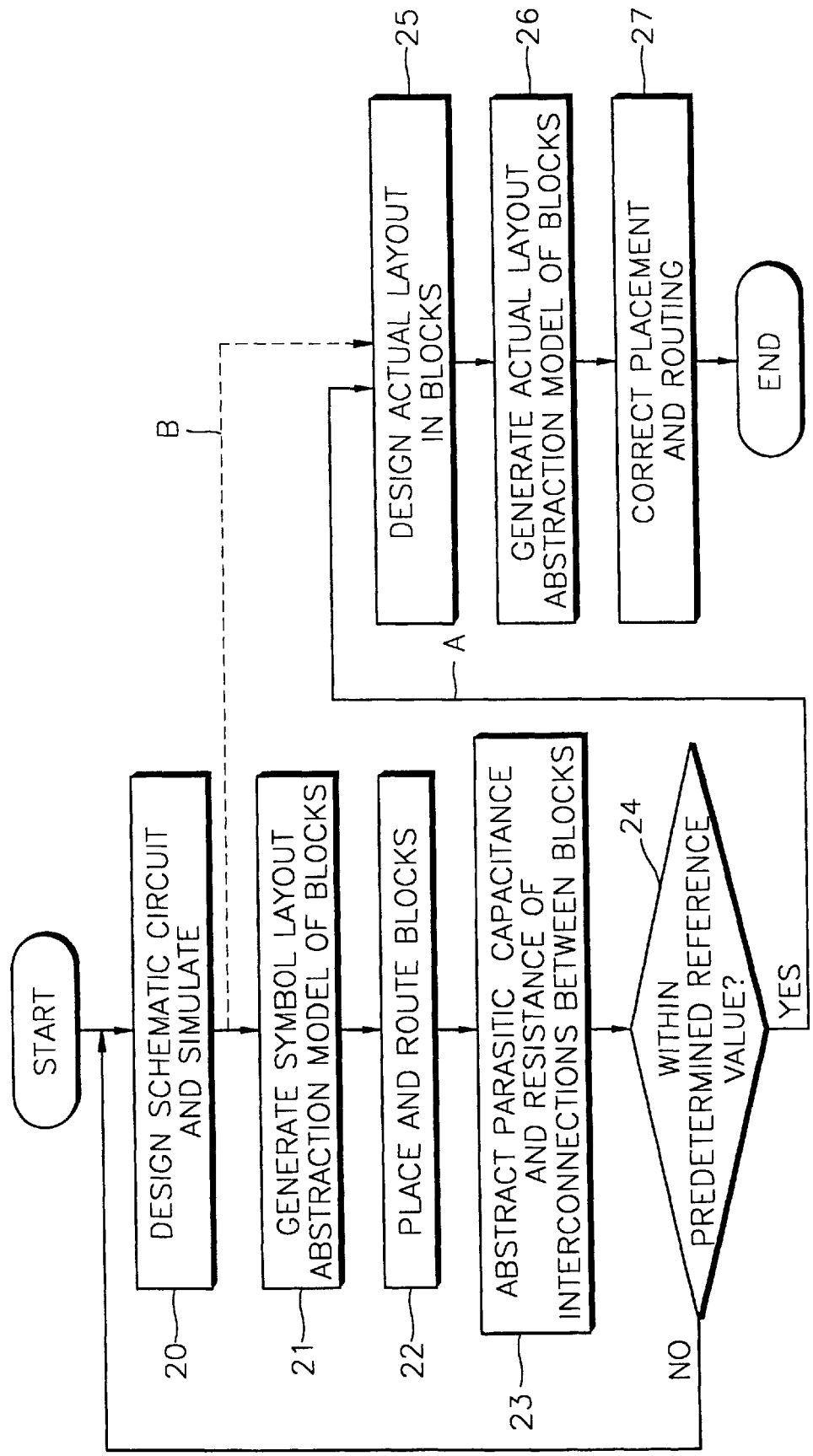
FIG. 2 is a flowchart that illustrates exemplary operations for designing an IC in accordance with embodiments of the present invention.
Figure 3:
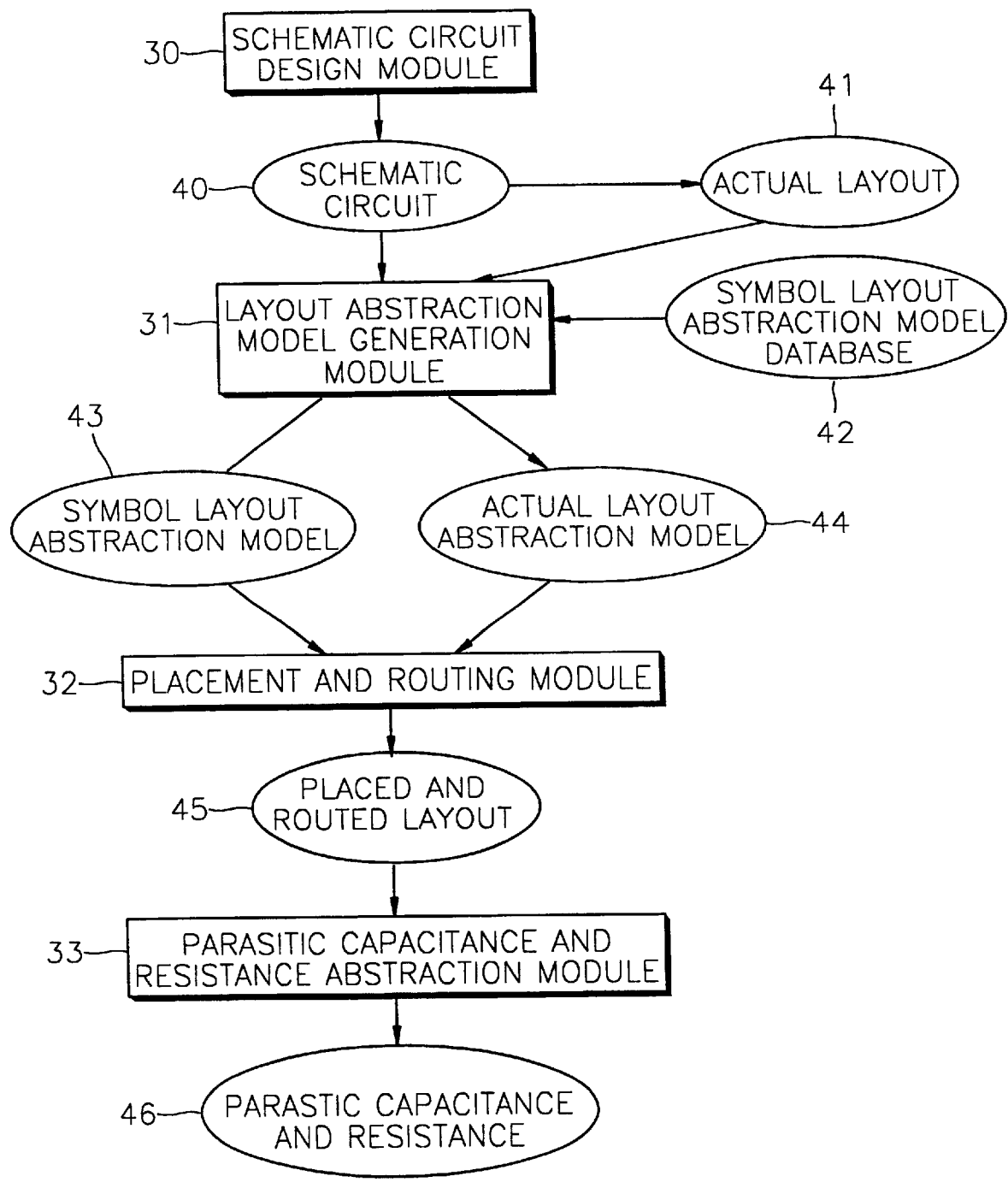
FIG. 3 is a block diagram that illustrates an exemplary IC design system and associated data flow in accordance with embodiments of the present invention.

FIG. 2 is a flowchart that illustrates exemplary operations for designing an integrated circuit (IC) in accordance with embodiments of the present invention and FIG. 3 is a block diagram that illustrates an exemplary IC design system and associated data flow in accordance with embodiments of the present invention. The rectangles of FIG. 3 denote modules for performing a given function and the ovals of FIG. 3 denote input/output data associated with the modules. Although FIG. 3 illustrates an exemplary software architecture that may facilitate the design of integrated circuits in accordance with embodiments of the present invention, it will be understood that the present invention is not limited to such a configuration, but is intended to encompass any configuration capable of carrying out the operations described hereafter.

Exemplary operations for designing an IC will be described hereafter with reference to FIGS. 2, 3, and 4. Referring now to FIG. 2, operations begin by drawing the IC as a circuit diagram and simulating operations thereof (block 20). As discussed hereinabove, the IC is typically drawn using units of cells and/or blocks, which may be expressed as a set of symbols having an electrical meaning. For example, a schematic circuit design module 30 as shown in FIG. 3 may be used to design each block so that it comprises one or more standard cells and/or non-standard cells for performing a given function. The schematic circuit design module 30 may be embodied as a commercial schematic circuit design program having a graphical user interface.

Figure 4:
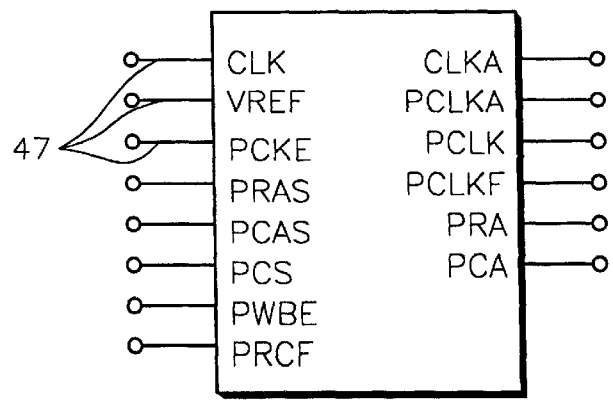
FIG. 4 is an exemplary block expressed as a symbol that includes a non-standard cell in accordance with embodiments of the present invention.

FIG. 4 is an exemplary block expressed as a symbol. More specifically, FIG. 4 illustrates a clock buffer in a peripheral circuit region of an IC memory device. The clock buffer includes fourteen input/output signal pins 47. The schematic circuit design module 30 of FIG. 3 maybe used to design a schematic circuit 40 (i.e., the transistor level design of the clock buffer of FIG. 4), which replaces the clock buffer symbol of FIG. 4 during a circuit simulation.

Still referring to block 20 of FIG. 2, when symbols for all blocks of the IC and their schematic circuits 40 are drawn, their electrical operation is simulated. If the simulation results indicate that the IC does not operate properly, then the simulation may be performed again after revising and/or correcting the circuit diagram of the IC (i.e., the symbols and their schematic circuits).

If the simulation results are satisfactory, then the layout abstraction model generation module 31 generates a symbol layout abstraction model 43 as shown in FIG. 3 for placing/arranging and routing each block expressed as a symbol (block 21). The symbol layout abstraction model 43 is generated by calculating the size of each block (each block for which a size is obtained may be referred to as a bounding block) based on the circuit elements in each block. For example, the symbol layout abstraction model 43 may comprise the following information for each of the blocks: the number and size (width and length) of transistors, the positions of each pin, the number of input/output and power pins, and/or obstructions through which an interconnection can not pass.

Figure 5:
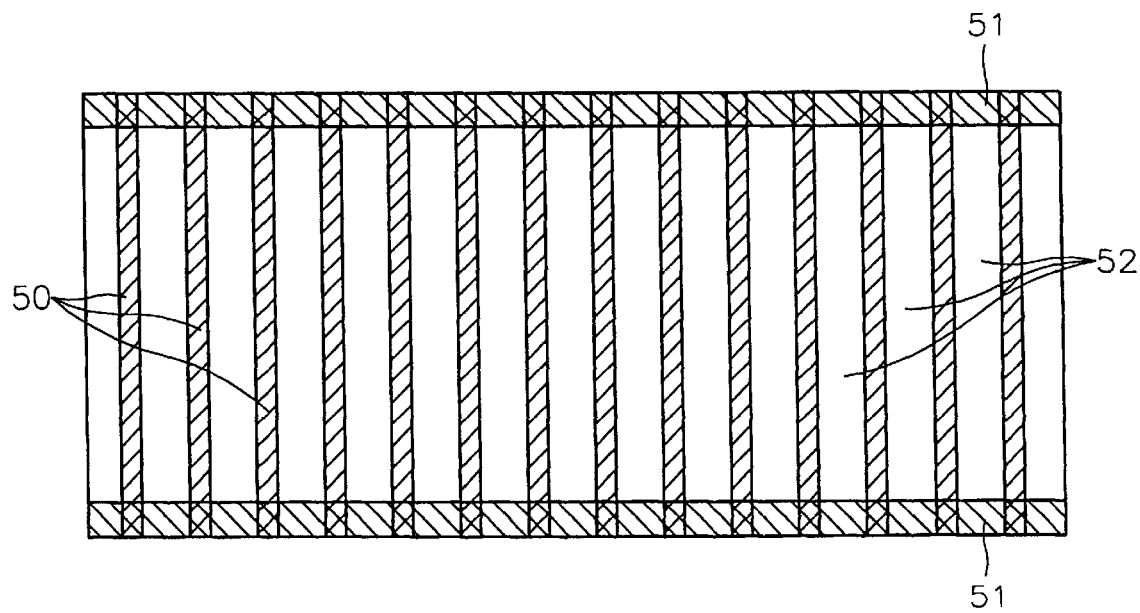
FIG. 5 is an exemplary symbol layout abstraction model in accordance with embodiments of the present invention.

FIG. 5 is an exemplary symbol layout abstraction model for the clock buffer shown in FIG. 4. The symbol layout abstraction model of the clock buffer shown in FIG. 5 comprises information related to the physical size of the clock buffer, available positions of fourteen input/output signal pins 50, and positions of two power pins 51. Note that the symbol layout abstraction model of the clock buffer does not include information related to the actual layout of the schematic circuit of the block buffer. In FIG. 5, reference numeral 50 denotes positions in which vias may be formed to connect layers of each of the pins to metal interconnections, which are used to connect the clock buffer to other blocks. Reference numeral 52 denotes an obstruction through which the metal layers of a pin 50 can not pass and the via can not be formed. For example, an obstruction 52 may be a region in which a dummy pattern is located. Note that positions of the pins 50 are arbitrarily selected because the actual layout of the schematic circuit of the clock buffer has not been designed yet.

As shown in FIG. 3, the layout abstraction model generation module 31 may cooperate with a symbol layout abstraction model database 42 to generate the symbol layout abstraction model 43. The symbol layout abstraction model database 42 is an information repository that comprises layout information associated with one or more template blocks. The layout information associated with the template blocks may comprise the type, number, and size of the circuit elements contained in the template block along with obstruction information. The database 42 may be generated by collecting actual layout information for blocks used in conventional ICs. Thus, the layout abstraction model generation module 31 may associate layout information corresponding to a template block in the symbol layout abstraction model database 42 with one or more of the blocks comprising the IC circuit diagram.

Referring still to FIGS. 2 and 3, after the symbol layout abstraction model 43 has been generated for each of the blocks comprising the IC, a placement and routing module 32 places/arranges the blocks in a restricted physical plane of the chip and determines routes for forming connections between pins of the various blocks to generate a placed and routed layout 45 (block 22). In general, the placement and routing module 32 may be embodied as a commercial automated placement and routing tool.

After the placed and routed layout 45 is generated, a parasitic capacitance and resistance abstraction module 33 abstracts or estimates the parasitic capacitance and resistance 46 for interconnections between pins of the various blocks comprising the IC (block 23). The parasitic capacitance and resistance 46 of each interconnection may be used to evaluate an RC delay, which generally can not be evaluated based on the schematic circuit 40 expressed as a collection of electrical symbols. The parasitic capacitance and resistance 46 may be calculated based on the length, width, and thickness of each interconnection of the placed and routed layout 45, whether other interconnections pass around a current interconnection, and the interconnection material. The parasitic capacitance and resistance abstraction module 33 may be embodied as a commercial program.

Next, it may be determined whether the parasitic capacitance and/or the resistance 46 of each of the interconnections are within predetermined reference values (block 24). If the parasitic capacitance and/or the resistance deviate from their respective reference values, then operations return to block 20 to revise and/or correct the schematic circuit 40 of the IC. Even though it may be possible to improve the parasitic capacitance and/or resistance so that one or both is within predetermined reference values by revising and/or correcting the placement and interconnections of the blocks, typically the schematic circuit 40 is revised and/or corrected.

After revising and/or correcting the schematic circuit 40, operations corresponding to blocks 21 through 24 of FIG. 2 may be repeated as discussed hereinabove based on the revised and/or corrected schematic circuit 40.

If the parasitic capacitance and/or the resistance are within their respective reference values, then an actual layout 41 is designed for each block based on the schematic circuit 40 (block 25; arrow A). As discussed hereinabove, generating an actual layout for a block may comprise designing material patterns having an actual physical meaning based on the schematic circuit of the block. Recall that blocks that comprise non-standard cells are typically laid out manually, which may be time intensive.

When the actual layout 41 of each block is completed, the layout abstraction model generation module 31 generates an actual layout abstraction model 44 for each block based on the actual layout 41 of each block (block 26). The actual layout abstraction model 44 of each block may comprise information on the actual size of the blocks, the actual position of each pin, and the actual position of each obstruction.

In general, the actual layout abstraction model 44 may not be entirely consistent with the symbol layout abstraction model 43. Therefore, the placement and routing based on the symbol layout abstraction model 43 may be corrected based on the actual layout abstraction model 44 (block 27). Correcting the symbol layout abstraction model 43 may involve reducing/enlarging the size of each block and changing the position of each pin so that the placed and routed layout 45 based on the symbol layout abstraction model 43 is consistent with the size of the block and the position of each pin in the actual layout abstraction model 44.

Advantageously, according to embodiments of the present invention, the blocks comprising an IC may be placed and routed based on the symbol layout abstraction model 43 without having to generate an actual layout 41 for each block first, which may be time intensive. Moreover, RC delays may be evaluated by abstracting the parasitic capacitance and resistance of each interconnection before generating the actual layout 41 for each of the blocks. Because the actual layout design of each block is performed only after a satisfactory arrangement/placement and routing of the blocks based on the symbol layout abstraction model 43 has been achieved, it may be possible to reduce the overall time involved in designing the IC.

In accordance with further embodiments of the present invention, the operations associated with blocks 25 and 26 of FIG. 2 may be performed in parallel with the operations associated with one or more of the blocks 21 through 24 as represented by arrow B. In addition, when the schematic circuit 40 is revised because the parasitic capacitance and/or the resistance deviate from their respective reference values, then the revised and/or corrected schematic circuit 40 may be immediately used in designing an actual layout for each block at block 25 as represented by arrow B.

The flowchart of FIG. 2 illustrates the architecture, functionality, and operations of a possible implementation of the layout abstraction model generation module 31 software. In this regard, each block represents a module, segment, or portion of code, which comprises one or more executable instructions for implementing the specified logical function(s). It should also be noted that in some alternative implementations, the functions noted in the blocks may occur out of the order noted in FIGS. 2. For example, two blocks shown in succession may in fact be executed substantially concurrently or the blocks may sometimes be executed in the reverse order, depending on the functionality involved.

Figure 6:
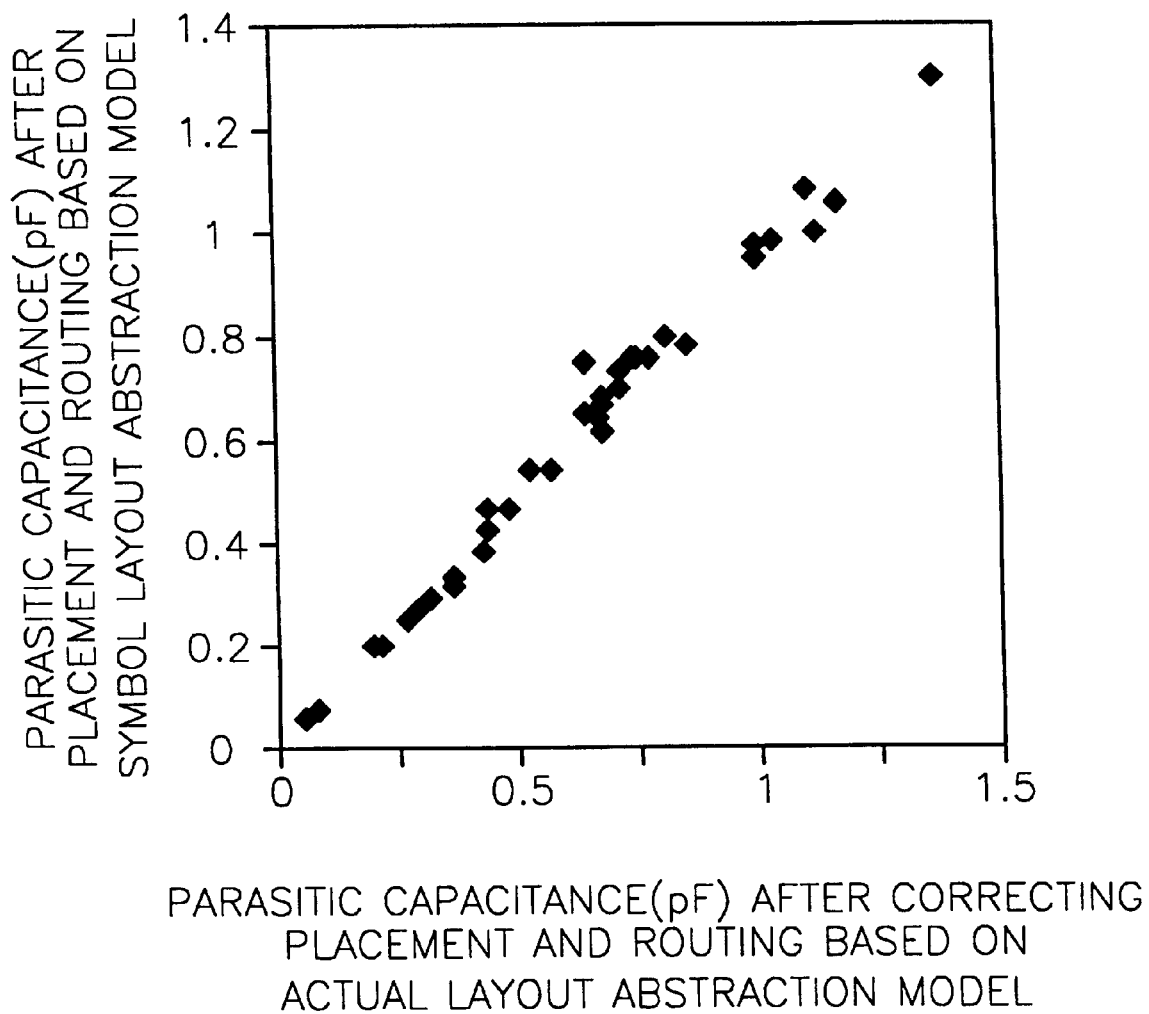
FIG. 6 is a graph that illustrates a comparison of parasitic capacitance abstracted after placing and routing blocks based on a symbol layout abstraction model with parasitic capacitance abstracted after correcting the placement and routing of blocks based on an actual layout abstraction model in accordance with embodiments of the present invention.

FIG. 6 is a graph that compares the parasitic capacitance for forty interconnections that were arranged and routed based on the symbol layout abstraction model 43 (vertical axis) with the parasitic capacitance for the forty interconnections after the blocks were arranged and routed based on the actual layout abstraction model 44 (horizontal axis). As shown in FIG. 6, the parasitic capacitance obtained for the forty interconnections that were arranged and routed based on the symbol layout abstraction model 43 corresponds closely to the parasitic capacitance obtained for the forty interconnections after the blocks were arranged and routed based on the actual layout abstraction model 44. Specifically, an average error of less than 5% was obtained. Thus, the symbol layout abstraction model 43 may be sufficient for use in arranging/placing and routing blocks in accordance with embodiments of the present invention.

The design and layout of an IC may be performed by an automated tool (program) including the operations of designing the schematic circuit and simulation, and arranging/placing and routing the blocks. The layout abstraction generation module 31 may be embodied as a computer program for generating the symbol layout abstraction model from the schematic circuit. Also, the layout abstraction model generation module 31 may be a sub-program of an integrated automated tool for designing an IC, which comprises a conventional schematic circuit design module 30 and placement/routing module 32. Also, the symbol layout abstraction model database 42 may be incorporated into the automated tool to facilitate generation of the symbol layout abstraction model.

From the foregoing it can be seen that the present invention may allow the symbol layout abstraction model for each block to be generated directly from the schematic circuit of the blocks, which may include non-standard cells. Furthermore, placing/arranging and routing of the blocks, and correcting the schematic circuit may be performed without designing actual layouts for the blocks. Accordingly, the time required to design and layout an IC may be reduced.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of designing an integrated circuit, comprising:
    generating a circuit diagram of the integrated circuit using a first plurality of blocks;
    providing an information repository that comprises layout information associated with respective ones of a plurality of template blocks;
    generating a symbol layout abstraction model by associating the layout information that is associated with at least one of the plurality of template blocks with at least one of the first plurality of blocks;
    generating an initial arrangement of the first plurality of blocks in a defined area based on the symbol layout abstraction model;
    determining initial interconnections between ones of the first plurality of blocks based on the symbol layout abstraction model;
    estimating at least one of a parasitic capacitance and a resistance for at least one of the initial interconnections;
    determining whether the estimate for the at least one of the initial interconnections is within a predetermined reference value; and designing respective material patterns for respective ones of the first plurality of blocks based on the circuit diagram if the estimate for the at least one of the initial interconnections is within the predetermined reference value.

2. The method of claim 1, wherein the layout information assoicated with the respective ones of the plurality of template blocks comprises at least one of size information, pin position information, and obstruction information.

3. The method of claim 2, wherein the layout information associated with the respective ones of the plurality of template blocks further comprises:
respective numbers of circuit elements contained in respective ones of the plurality of template blocks; and
respective sizes of the circuit elements contained in respective ones of the plurality of template blocks.

4. The method of claim 1, further comprising:
generating a revised circuit diagram of the integrated circuit using a second plurality of blocks if the estimate is not within the predetermined reference value.

5. The method of claim 4, further comprising:
designing respective material patterns for respective ones of the second plurality of blocks based on the revised circuit diagram;
generating an actual layout abstraction model that comprises layout information associated with respective ones of the respective material patterns;
generating an arrangement of the second plurality of blocks in the defined area based on the actual layout abstraction model; and
determining interconnections between ones of the second plurality of blocks based on the actual layout abstraction model.

6. The method of claim 4, further comprising:
associating the layout information that is associated with at least one of the plurality of template blocks with at least one of the second plurality of blocks to generate a revised symbol layout abstraction model;
generating a revised arrangement of the second plurality of blocks in the defined area based on the revised symbol layout abstraction model;
determining revised interconnections between ones of the second plurality of blocks based on the revised symbol layout abstraction model;
estimating at least one of a parasitic capacitance and a resistance for at least one of the revised interconnections;
determining whether the estimate for the at least one of the revised interconnections is within a predetermined reference value;
designing respective material patterns for respective ones of the second plurality of blocks based on the revised circuit diagram;
generating an actual layout abstraction model that comprises layout information associated with respective ones of the material patterns
generating a final arrangement of the second plurality of blocks in the defined area based on the revised arrangement of the second plurality of blocks and the actual layout abstraction model; and
determining final interconnections between ones of the second plurality of blocks based on the revised interconnections and the actual layout abstraction model.

7. The method of claim 1, further comprising:
generating an actual layout abstraction model that comprises layout information assocaited with respective ones of the material patterns.

8. The method of claim 7, wherein designing the respective material patterns and generating the actual layout abstraction model are performed in parallel with generating the symbol layout abstraction model, generating the initial arrangement of the first plurality of blocks, determining the initial interconnections, estimating the at least one of a parasitic capacitance and a resistance for the at least one of the initial interconnections, and determining whether the estimate for the at least one of the initial interconnections is within the predetermined reference value.

9. The method of claim 7, wherein the layout information associated with the respective ones of the material patterns comprises at least one of size information, pin position information, and obstruction information.

10. The method of claim 9, further comprising:
generating a final arrangement of the first plurality of blocks in the defined area based on the initial arrangement of the first plurality of blocks and the actual layout abstraction model; and
determining final interconnections between ones of the first plurality of blocks based on the initial interconnections and the actual layout abstraction model.

11. A system for designing an integrated circuit, comprising:
means for generating a circuit diagram of the integrated circuit using a first plurality of blocks;
means for providing an information repository that comprises layout information associated with respective ones of a plurality of template blocks;
means for generating a symbol layout abstraction model by associating the layout information that is associated with at least one of the plurality of template blocks with at least one of the first plurality of blocks;
means for generating an initial arrangement of the first plurality of blocks in a defined area based on the symbol layout abstraction model;
means for determining initial interconnections between ones of the first plurality of blocks based on the symbol layout abstraction model;
means for estimating at least one of a parasitic capacitance and a resistance for at least one of the initial interconnections;
means for determining whether the estimate for the at least one of the initial interconnections is within a predetermined reference value; and
means for designing respective material patterns for respective ones of the first plurality of blocks based on the circuit diagram if the estimate for the at least one of the initial interconnections is within the predetermined reference value.

12. The system of claim 11, wherein the layout information associated with the respective ones of the plurality of template blocks comprises at least one of size information, pin position information, and obstruction information.

13. The system of claim 12, wherein the layout information associated with the respective ones of the plurality of template blocks further comprises:
respective numbers of circuit elements contained in respective ones of the plurality of template blocks; and
respective sizes of the circuit elements contained in respective ones of the plurality of template blocks.

14. The system of claim 11, further comprising:
means for generating a revised circuit diagram of the integrated circuit using a second plurality of blocks if the estimate is not within the predetermined reference value.

15. The system of claim 14, further comprising:
means for designing respective material patterns for respective ones of the second plurality of blocks based on the revised circuit diagram;
means for generating an actual layout abstraction model that comprises layout information associated with respective ones of the respective material patterns;
means for generating an arrangement of the second plurality of blocks in the defined area based on the actual layout abstraction model; and
means for determining interconnections between ones of the second plurality of blocks based on the actual layout abstraction model.

16. The system of claim 14, further comprising:
means for associating the layout information that is associated with at least one of the plurality of template block with at least one of the second plurality of blocks to generate a revised symbol layout abstraction model;
means for generating a revised arrangement of the second plurality of blocks in the defined area based on the revised symbol layout abstraction model;
means for determining revised interconnections between ones of the second plurality of blocks based on the revised symbol layout abstraction model;
means for estimating at least one of a parasitic capacitance and a resistance for at least one of the revised interconnections;
means for determining whether the estimate for the at least one of the revised interconnections is within a predetermined reference value;
means for designing respective material patterns for respective ones of the second plurality of blocks based on the revised circuit diagram;
means for generating an actual layout abstraction model that comprises layout information associated with respective ones of the material patterns
means for generating a final arrangement of the second plurality of blocks in the defined area based on the revised arrangement of the second plurality of blocks and the actual layout abstraction model; and
means for determining final interconnections between ones of the second plurality of blocks based on the revised interconnections and the actual layout abstraction model.

17. The system of claim 11, further comprising:
means for generating an actual layout abstraction model that comprises layout information associated with respective ones of the material patterns.

18. The system of claim 17, wherein the layout information associated with the respective ones of the material patterns comprises at least one of size information, pin position information, and obstruction information.

19. The system of claim 18, further comprising:
means for generating a final arrangement of the first plurality of blocks in the defined area based on the initial arrangement of the first plurality of blocks and the actual layout abstraction model; and
means for determining final interconnections between ones of the first plurality of blocks based on the initial interconnections and the actual layout abstraction model.

20. A computer program product for designing an integrated circuit, comprising:
a computer readable program medium having computer readable program code embodied therein, the computer readable program code comprising:
computer readable program code for generating a circuit diagram of the integrated circuit using a first plurality of blocks;
computer readable program code for providing an information repository that comprises layout information associated with respective ones of a plurality of template blocks;
computer readable program code for generating a symbol layout abstraction model by associating the layout information that is associated with at least one of the plurality of template blocks with at least one of the first plurality of blocks;
computer readable program code for generating an initial arrangement of the first plurality of blocks in a defined area based on the symbol layout abstraction model;
computer readable program code for determining initial interconnections between ones of the first plurality of blocks based on the symbol layout abstraction model;
computer readable program code for estimating at least one of a parasitic capacitance and a resistance for at least one of the initial interconnections;
computer readable program code for determining whether the estimate for the at least one of the initial interconnections is within a predetermined reference value; and
computer readable program code for designing respective material patterns for respective ones of the first plurality of blocks based on the circuit diagram if the estimate for the at least one of the initial interconnections is within the predetermined reference value.

21. The computer program product of claim 20, wherein the layout information associated with the respective ones of the plurality of template blocks comprises at least one of size information, pin position information, and obstruction information.

22. The computer program product of claim 21, wherein the layout information associated with the respective ones of the plurality of template blocks further comprises:
respective numbers of circuit elements contained in respective ones of the plurality of template blocks; and
respective sizes of the circuit elements contained in respective ones of the plurality of template blocks.

23. The computer program product of claim 20, further comprising:
computer readable program code for generating a revised circuit diagram of the integrated circuit using a second plurality of blocks if the estimate is not within the predetermined reference value.

24. The computer program product of claim 23, further comprising:
computer readable program code for designing respective material patterns for respective ones of the second plurality of blocks based on the revised circuit diagram;
computer readable program code for generating an actual layout abstraction model that comprises layout information associated with respective ones of the respective material patterns;
computer readable program code for generating an arrangement of the second plurality of blocks in the defined area based on the actual layout abstraction model; and computer readable program code for determining interconnections between ones of the second plurality of blocks based on the actual layout abstraction model.

25. The computer program product of claim 23, further comprising:

computer readable program code for associating the layout information that is associated with at least one of the plurality of template blocks with at least one of the second plurality of blocks to generate a revised symbol layout abstraction model;

computer readable program code for generating revised arrangement of the second plurality of blocks in the defined area based on the revised symbol layout abstraction model;

computer readable program code for determining revised interconnections between ones of the second plurality of blocks based on the revised symbol layout abstraction model;

computer readable program code for estimating at least one of a parasitic capacitance and a resistance for at least one of the revised interconnections;

computer readable program code for determining whether the estimate for the at least one of the revised interconnections is within a predetermined reference value;

computer readable program code for designing respective material patterns for respective ones of the second plurality of blocks based on the revised circuit diagram;

computer readable program code for generating an actual layout abstraction model that comprises layout information associated with respective ones of the material patterns computer readable program code for generating a final arrangement of the second plurality of blocks in the defined area based on the revised arrangement of the second plurality of blocks and the actual layout abstraction model; and computer readable program code for determining final interconnections between ones of the second plurality of blocks based on the revised interconnections and the actual layout abstraction model.

26. The computer program product of claim 20, further comprising:

computer readable program code for generating an actual layout abstraction model that comprises layout information associated with respective ones of the material patterns.

27. The computer program product of claim 26, wherein the layout information associated with the respective ones of the material patterns comprises at least one size information, pin position information, and obstruction information.

28. The computer program product of claim 27, further comprising:

computer readable program code for generating a final arrangement of the first plurality of blocks in the defined area based on the initial arrangement of the first plurality of blocks and the actual layout abstraction model; and computer readable program code for determining final interconnections between ones of the first plurality of blocks based on the initial interconnections and the actual layout abstraction model.

* * * * *

UNITED STATES PATENT AND TRADEMARK OFFICE
CERTIFICATE OF CORRECTION

PATENT NO.   : 6,539,528 B2
DATED        : March 25, 2003
INVENTOR(S)  : Hwang et al.

It is certified that error appears in the above-identified patent and that said Letters Patent is hereby corrected as shown below:

Column 13,
Line 11, should read -- computer readable program code for generating a revised --

Signed and Sealed this

Ninth Day of December, 2003

JAMES E. ROGAN
*Director of the United States Patent and Trademark Office*